US010354597B2

(12) United States Patent
Christmann et al.

(10) Patent No.: US 10,354,597 B2
(45) Date of Patent: Jul. 16, 2019

(54) OPTICAL DETECTION DEVICE AND METHOD OF CONTROLLING SAME

(71) Applicant: e.solutions GmbH, Ingolstadt (DE)

(72) Inventors: Stefan Christmann, Geislingen/Steige (DE); Thomas Franke, Laupheim (DE)

(73) Assignee: e.solutions GmbH (DE)

( * ) Notice: Subject to any disclaimer, the term of this patent is extended or adjusted under 35 U.S.C. 154(b) by 0 days.

(21) Appl. No.: 14/919,074

(22) Filed: Oct. 21, 2015

(65) Prior Publication Data

US 2016/0147091 A1    May 26, 2016

(30) Foreign Application Priority Data

Nov. 21, 2014 (DE) .......................... 10 2014 017 281

(51) Int. Cl.
*G02F 1/137* (2006.01)
*G09G 3/36* (2006.01)
*G09G 3/34* (2006.01)
*G02F 1/1335* (2006.01)
*G01J 1/00* (2006.01)
(Continued)

(52) U.S. Cl.
CPC .............. *G09G 3/3406* (2013.01); *G01J 1/00* (2013.01); *G03B 9/02* (2013.01); *G03B 11/043* (2013.01); *H01L 27/1446* (2013.01); *G02F 1/13306* (2013.01); *G09G 2320/0626* (2013.01); *G09G 2360/144* (2013.01)

(58) Field of Classification Search
CPC .......... G09G 3/36; G09G 3/34; G09G 3/3611; G09G 3/3406; G09G 2360/144; G09G 2320/0626
See application file for complete search history.

(56) References Cited

U.S. PATENT DOCUMENTS

| 2008/0018834 A1* | 1/2008 | Matsushima | ........ | G02B 27/286 |
|---|---|---|---|---|
| | | | | 349/98 |
| 2009/0009628 A1* | 1/2009 | Janicek | .................. | H04N 7/144 |
| | | | | 348/231.99 |

(Continued)

FOREIGN PATENT DOCUMENTS

| DE | 4305807 A1 | 10/1994 |
|---|---|---|
| DE | 19644662 A1 | 4/1998 |

(Continued)

OTHER PUBLICATIONS

Office Action for corresponding German Application No. 10 2014 017 281.3, dated Jul. 24, 2015.

*Primary Examiner* — Md Saiful A Siddiqui
(74) *Attorney, Agent, or Firm* — Tarolli, Sundheim, Covell & Tummino LLP

(57) ABSTRACT

An optical device is described. The device has a sensor having a light incident side, wherein the sensor is designed to convert light that is incident upon the light incident side into an electrical signal. In one embodiment, the device further has at least one lens and a liquid crystal device which is arranged in front of the light incident side of the sensor in such a manner that the at least one lens is situated between the liquid crystal device and the sensor, wherein the liquid crystal device comprises at least one region whose light transmission is electronically controllable. There are further described an electronic device, a method of controlling an optical device, and a computer program.

15 Claims, 8 Drawing Sheets

(51) Int. Cl.
*H01L 27/144* (2006.01)
*G03B 9/02* (2006.01)
*G03B 11/04* (2006.01)
*G02F 1/133* (2006.01)

(56) References Cited

U.S. PATENT DOCUMENTS

| | | | | |
|---|---|---|---|---|
| 2009/0153438 | A1* | 6/2009 | Miller | G06F 3/0488 |
| | | | | 345/55 |
| 2009/0237381 | A1* | 9/2009 | Otani | G02F 1/1362 |
| | | | | 345/207 |
| 2010/0039414 | A1* | 2/2010 | Bell | G09G 3/20 |
| | | | | 345/207 |
| 2012/0068182 | A1* | 3/2012 | Yamanaka | H01L 21/268 |
| | | | | 257/59 |
| 2012/0188347 | A1* | 7/2012 | Mitchell | A61B 1/00193 |
| | | | | 348/50 |
| 2012/0249724 | A1* | 10/2012 | Morrison | G06F 3/013 |
| | | | | 348/14.16 |
| 2013/0242479 | A1* | 9/2013 | Yoo | H05K 5/0017 |
| | | | | 361/679.01 |
| 2014/0183342 | A1* | 7/2014 | Shedletsky | G06F 1/1637 |
| | | | | 250/215 |
| 2015/0163387 | A1* | 6/2015 | Lee | H04N 5/238 |
| | | | | 349/2 |

FOREIGN PATENT DOCUMENTS

| | | |
|---|---|---|
| DE | 20215365 U1 | 2/2004 |
| EP | 1696414 A1 | 8/2006 |
| EP | 2461212 A1 | 6/2012 |
| EP | 2662748 A1 | 11/2013 |
| JP | 2001265463 A | 9/2001 |
| JP | 2004274548 A | 9/2004 |
| JP | 2014197203 A | 10/2014 |

\* cited by examiner

OPTICAL DETECTION DEVICE AND METHOD OF CONTROLLING SAME

RELATED APPLICATIONS

The present invention is claims priority from DE 10 2014 017 281.3, filed 21 Nov. 2014, the entirety of which is incorporated herein by reference.

TECHNICAL FIELD

The present disclosure relates generally to the field of optical detection devices. In concrete terms there is provided an optical detection device, an electronic device, a method of controlling an optical detection device, and a computer program.

BACKGROUND

In many areas of electronics, in particular entertainment electronics and automotive electronics, optical detection devices are increasingly being used. Examples of optical detection devices are camera devices which are used to record and further process optical still images or moving images of a very wide variety of situations. In particular small format camera devices with CCD sensors or CMOS sensors are becoming increasingly important because they are inexpensive, do not take up much space and accordingly are versatile in their use. Such camera devices are used, for example, in mobile telephones (smart phones), laptops, tablet computers, but also in stand-alone camera systems (e.g. in compact digital cameras). Such camera devices are used in particular in automotive electronics, for example in order to capture images of the road or to allow occupants of the vehicle to make video calls or to take photographs of themselves or of the surroundings. Further examples of optical detection devices are devices with ambient light sensors (ALS), which are used to detect the brightness of the surroundings.

Optical detection devices generally have a light inlet opening of a specific diameter (aperture). The light which passes through the light inlet opening (optionally focused by a lens or lens group) strikes the optical sensor. The optical sensor converts the incident light into electrical signals for further evaluation by an evaluation unit. Such optical detection devices are often arranged behind a light inlet opening of a surface that is otherwise opaque to light. The surface that is opaque to light can be, for example, the frame of a liquid crystal display device of a mobile telephone, of a laptop computer or of a tablet computer. The surface that is opaque to light can further be a (plastics) paneling of a motor vehicle.

In order to arrange a camera device behind the surface that is opaque to light, a (mostly circular or square) opening must be provided in the surface that is opaque to light, which opening does not impair the visual appearance of the otherwise visually homogeneous surface. It is often not desirable to incorporate the camera device into the design (for example of a display frame) as a visible element. A further problem is that a camera which is visible to an observer can also record images of the observer unnoticed, which is often undesirable for reasons of safety and privacy. In order to eliminate the above-mentioned problems, mechanical shutters are known from the prior art which can either be slid in front of the camera device by hand or are electronically actuatable so that they either close or open the light inlet opening for the camera device.

Furthermore, some (mostly higher quality) camera devices have an optical diaphragm (iris) for influencing the amount of light that is incident upon the sensor. The brightness of a recorded image can thus be controlled by a combination of the diaphragm opening and an exposure time. The diaphragm is also used to regulate a degree of depth of focus of the recorded image or to produce a bokeh effect. Such diaphragms are generally formed mechanically from individual blades and are accordingly expensive and susceptible to vibration. Owing to the relatively high outlay for their manufacture, their overall size and their price, such mechanical diaphragms are rarely used in less expensive or more compact camera devices.

SUMMARY

A technology is therefore to be provided which eliminates one or more problems of known optical detection devices.

According to a first aspect, an optical detection device is provided. The optical detection device comprises a sensor having a light incident side, wherein the sensor is designed to convert light that is incident upon the light incident side into an electrical signal. The optical detection device further comprises at least one lens and a liquid crystal device which is arranged in front of the light incident side of the sensor in such a manner that the at least one lens is situated between the liquid crystal device and the sensor, wherein the liquid crystal device comprises at least one region whose light transmission is electronically controllable.

The optical detection device according to the first aspect can be, for example, a camera device. The sensor in this case can be, for example, an image sensor (e.g. a CCD or CMOS sensor). There can further be provided a corresponding evaluation unit for evaluating the electrical signal of the sensor.

The lens can be, for example, a converging lens or a diverging lens. One or more further lenses can be provided in the beam path between the liquid crystal device and the sensor both in front of and behind the at least one lens. Alternatively or in addition, further lenses or a further lens can be provided in the beam path on a side of the liquid crystal device that is remote from the sensor, that is to say closer to a light inlet opening of the camera device.

According to a second aspect, an optical detection device is provided. The optical detection device comprises a sensor having a light incident side, wherein the sensor is designed to convert light that is incident upon the light incident side into an electrical signal. The optical detection device comprises a liquid crystal device which is arranged in front of the light incident side of the sensor, wherein the liquid crystal device comprises at least one region whose light transmission is electronically controllable. The optical detection device further comprises a control device for controlling a display brightness of a display device on the basis of the electrical signal.

The optical sensor according to the second aspect can be, for example, an ambient light sensor (ALS). The sensor can in this case be, for example, a photodiode, a phototransistor or a light-dependent resistor or the image sensor mentioned above. The sensor can emit a current or voltage value, for example, on the basis of which the display brightness of the display device is controlled by the control device. The display device can be, for example, a liquid crystal display device, wherein the display brightness can be controlled by controlling the intensity of a background illumination. Alternatively, the display device can be, for example, an OLED or LED display device, wherein the display brightness can be controlled by controlling the voltage applied to the OLEDs or LEDs. The control device can be, for example, a separate control electronics circuit, or the control device can be integrated into a central control unit (for example a processor) of an electronic device.

The liquid crystal device can comprise a first polarisation filter, a second polarisation filter, a liquid crystal layer situated between the first polarisation filter and the second polarisation filter, and at least one electrode for generating an electric field in the liquid crystal layer. The light transmission of the region can be controllable in dependence on the electric field that is generated. The light transmission of the region can be controllable, for example, in a binary manner (on/off) or continuously.

The light transmission of the at least one region can be switchable at least between a substantially transparent state and a substantially opaque state. The substantially transparent state and the substantially opaque state can be so designed that those states permit a state of the region of the liquid crystal device that is as transparent as technically possible or as opaque as technically possible, respectively.

The at least one region can be in the substantially opaque state when no voltage is applied to the at least one electrode. The region of the liquid crystal device is accordingly substantially impermeable to light (opaque) when no electric field is generated in the region. In this case, this is a normally black mode (NB) of the liquid crystal device.

The at least one region can be switchable between the substantially transparent state, the substantially opaque state and at least one partially opaque state. The partially opaque state can be an intermediate state in which the light transmission of the region in question has an intermediate value between the light transmission of the substantially opaque state and the light transmission of the substantially transparent state. The light transmission of the respective regions can be switched, for example, in such a manner that a continuous transition from the substantially transparent state to the substantially opaque state is possible, and vice versa.

The liquid crystal device can comprise a plurality of regions whose light transmission is individually electronically controllable. The optical detection device can thereby comprise, for example, an electrode or an electrode pair for each of the regions, for independently applying an electric field for each of the plurality of regions. The regions can be switched independently of one another between the substantially transparent state and the substantially opaque state, so that different patterns of substantially opaque and substantially transparent regions of the liquid crystal device can be obtained.

The regions can be arranged as an arbitrary matrix. The regions can be arranged, for example, as square regions or as rectangular regions in a matrix in the manner of a tiled structure. The individual regions of the matrix can be switched individually into the substantially transparent state or the substantially opaque state. To that end, for example, a plurality of electrodes arranged in a matrix can be provided, wherein each of the electrodes can be allocated to one of the regions.

The regions can be arranged as concentric rings. To that end, for example, an electrode substantially in the form of an annulus can be provided for each of the regions. The regions arranged as concentric rings can be arranged in such a manner that adjacent regions touch one another or in such a manner that adjacent regions are as close to one another as possible. The regions arranged as concentric rings can be switchable in such a manner that circular, substantially transparent regions of the liquid crystal device having different diameters can be generated by corresponding applied electric fields.

The liquid crystal device can comprise a single region whose light transmission is electronically controllable. To that end, the single region can be controlled, for example, by a single electrode or a single electrode pair, so that the light transmission of the single region is controllable by a voltage applied to the electrode or electrode pair.

The single region or the plurality of single regions in their totality can cover the lens and/or the sensor over the entire surface when seen in a plan view. A plan view can mean a viewing direction along the optical axis of the lens. The one region or the plurality of regions in their totality can cover the lens and/or the sensor, when seen in a plan view, in such a manner that, when all the regions are in the substantially opaque state, underlying elements of the optical detection device are not visible or are visible only with difficulty to an observer. The one region or the plurality of regions in their totality can cover a light inlet opening, which is situated above the lens and/or the sensor when seen in a plan view, over the entire surface when seen in a plan view, so that in the opaque state the elements (for example the sensor and/or the lens) arranged behind the liquid crystal device cannot be seen by a user (and, for example, the recording of an image is not possible). The single region or the plurality of regions in their totality can cover the light inlet opening in front of the optical detection device in such a manner that, in the substantially opaque state, the optical detection device is not substantially different visually from its surroundings (for example a display frame) when seen in a plan view.

According to a third aspect, an electronic device is provided. The electronic device comprises a display device and an optical detection device as described herein. The electronic device can be, for example, a portable electronic device and in particular a mobile telephone, a smart phone, a tablet computer, a laptop, a computer monitor or a combination of any of the above-mentioned devices. The display device can be, for example, a liquid crystal display device, an OLED display device or an E-paper display device.

The optical detection device can be provided behind a light inlet opening of a frame of the display device. The frame can be a frame of a display device which covers regions of a liquid crystal display device substrate in which no pixels for representing an image are arranged. The frame can further cover control devices for the display device, wherein the frame can be, for example, a black frame which is opaque to light. However, the frame can also be, for example, permeable to light, that is to say transparent. It can have light-scattering properties, for example (so that the frame appears milky white). The frame can also have, for example, any desired colour including white. The light inlet opening of the frame can be a hole in the frame which is provided for the arrangement of the optical detection device therebehind or therein.

The at least one region can cover the light inlet opening over the entire surface when seen in a plan view. The at least one region, that is to say either a single region or a plurality of regions in their totality, can cover the light inlet opening in such a manner that, when all the regions are in the substantially opaque state, elements of the optical detection device underneath the liquid crystal device are not visible to a user. The electronic device can be so designed that there is no visual difference between the frame and the light inlet opening of the frame in the substantially opaque state of the at least one region, that is to say the optical detection device can be visually concealed behind the frame. In one possible embodiment, there are no optical components (such as, for example, lenses) between the liquid crystal device and the light inlet opening.

A common transparent front cover can be provided in front of the optical detection device and the display device. The common transparent front cover can be, for example, a common front glass which is provided to protect the display device and the optical detection device.

A switch can be provided on an outer side of a casing of the electronic device for switching the at least one region from a substantially opaque state into a substantially transparent state. On operation of the switch by a user, the at least one region can change from the substantially opaque state into the substantially transparent state, so that the region of the liquid crystal device becomes transparent and the optical detection device can be used for acquiring optical signals. The transition can take place continuously, in steps or in a binary manner (on/off).

According to a fourth aspect there is provided a method of controlling an optical detection device which comprises a sensor having a light incident side, wherein the sensor is designed to convert light that is incident upon the light incident side into an electrical signal, at least one lens and a liquid crystal device which is arranged in front of the light incident side of the sensor in such a manner that the at least one lens is situated between the liquid crystal device and the sensor. The method comprises electronically controlling the light transmission of at least one region of the liquid crystal device. When the light transmission of the region of the liquid crystal device is controlled, the region can change from a substantially opaque state into a substantially transparent state.

According to a fifth aspect there is provided a method of controlling an optical detection device which comprises a sensor having a light incident side, wherein the sensor is designed to convert light that is incident upon the light incident side into an electrical signal, and a liquid crystal device which is arranged in front of the light incident side of the sensor. The method comprises electronically controlling the light transmission of at least one region of the liquid crystal device and controlling a display brightness of a display device on the basis of the electrical signal. For the acquisition of the electrical signal, the at least one region can be switched briefly (and, for example, cyclically) into a state of high light transmission.

The methods presented herein can be carried out, for example, by a processor of an electronic device which comprises both the optical detection device and the display device.

According to a sixth aspect there is provided a computer program which is configured to carry out the step of the methods presented herein.

BRIEF DESCRIPTION OF THE DRAWINGS

Further features, advantages and objects of the present disclosure will become apparent from the following detailed description and from the drawings, in which.

DETAILED DESCRIPTION

Figure 1A:
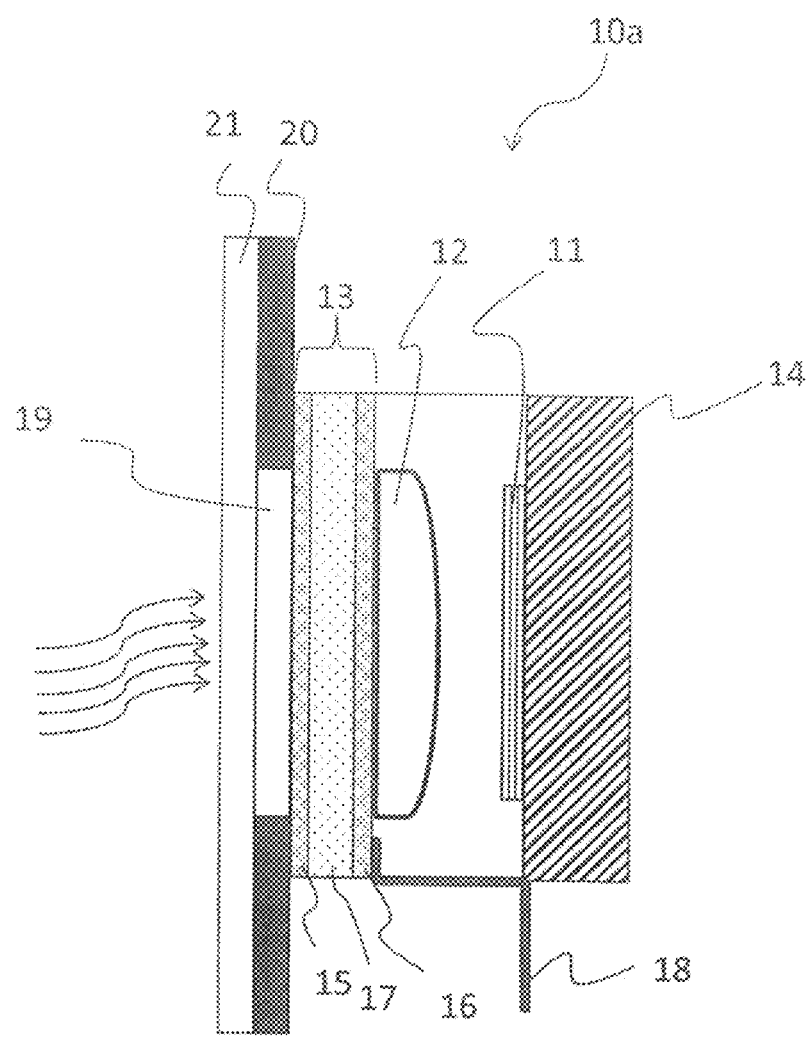
FIG. 1A is a schematic cross-section of an embodiment of an optical detection device which comprises at least one lens.

FIG. 1A shows a schematic cross-section of an embodiment of a camera device 10a. The representations of FIG. 1A and of the further figures of this disclosure serve merely for illustration and are not to be interpreted as being limiting. The proportions of the individual elements are not necessarily true to scale and may differ from the proportions shown.

The camera device 10a comprises an optical sensor 11 having a light incident side. The optical sensor 11 can in particular be an image sensor. In the representation of FIG. 1A, the light incident side is the left side of the sensor 11, incident light being symbolised by wavy arrows. The camera device 10a further comprises a lens 12 and a liquid crystal device 13, which is arranged in front of the light incident side of the sensor 11 in such a manner that the lens 12 is situated between the liquid crystal device 13 and the sensor 11. The liquid crystal device 13 comprises at least one region (not shown explicitly in FIG. 1A) whose light transmission is electronically controllable. Details of the at least one region are described in connection with FIGS. 5-7D.

In the following description, a first element which is arranged "in the beam path of the camera device 10a in front of" a second element is so arranged that it is positioned closer to a light incident side of the camera device 10a than the second element (further to the left in the representation of FIG. 1A).

The sensor 11 is an optical sensor (for example a CCD or CMOS sensor, a photodiode, a phototransistor or a light-dependent resistor) which converts incident light in the visible wavelength range and/or in the infrared or ultraviolet wavelength range into an electrical signal. The sensor 11 can be applied to a substrate 14 for that purpose. An evaluation unit (not shown) for evaluating and further processing the electrical signal can be situated on the substrate 14. The sensor 11 can be subdivided into pixels, the sensor 11 generating an electrical signal for each of the pixels. Furthermore, corresponding colour filters (for example red, green and blue colour filters in a Bayer array) can be provided in front of the pixels in order to produce a colour image. The sensor 11 and the evaluation unit can be configured to produce still images (photographs) and/or moving images (videos). The sensor 11 can, however, also be a monochrome optical sensor and/or an infrared or ultraviolet sensor. The sensor 11 can have a plurality of pixels or, in one possible embodiment, merely a single light-sensitive region (e.g. in order merely to detect a brightness value). In order to ensure a precise shutter speed, a mechanical shutter (not shown) can additionally be provided in the beam path in front of the sensor 11.

In one embodiment, the lens 12 serves to image an object situated in front of the camera device 10a on the sensor 11. As is shown in FIG. 1A, merely one lens 12 can be provided for that purpose. However, one or more further lenses can be provided in the beam path in front of or behind the lens 12, which further lenses form a lens group together with the lens 12. In order to produce a sharp image of the object on the sensor (focusing), the lens 12 or the lens group can be movably mounted, so that the lens 12 or the lens group can be moved, in an electronically controlled manner, parallel to the optical axis of the camera device 10a (the horizontal direction in FIG. 1A). In one possible embodiment, no lens is provided in the beam path of the camera device 10a in front of the liquid crystal device 13.

The liquid crystal device 13 is arranged in the beam path of the camera device 10a in front of the lens 12 in such a manner that the lens 12 is situated between the liquid crystal device 13 and the sensor 11. The liquid crystal device 13 comprises a first polarisation filter 15, a second polarisation filter 16 and a liquid crystal layer 17, which is situated between the first and second polarisation filters 15, 16. The polarisation filters 15, 16 are configured to polarise unpolarised incident light into a transmission axis of the polarisation filter 15, 16, so that the light is linearly polarised in the direction of the transmission axis when it leaves the polarisation filters 15, 16. The two polarisation filters 15, 16 can be so arranged, for example, that their respective transmission axes are oriented parallel to one another or are oriented at an angle of 90° relative to one another (so-called crossed Nicols arrangement). The liquid crystal layer 17 contains liquid crystal molecules which change their orientation when an electric field is applied to the liquid crystal layer, so that a polarisation direction of light passing through the liquid crystal layer 17 can be changed.

For applying an electric field in the liquid crystal layer 17, the liquid crystal device 13 comprises at least one electrode (not shown in FIG. 1A). For the electrical contacting of the electrode there is provided an electrical connection 18 via which a voltage can be applied to the electrode. A control unit (not shown) is provided for supplying the voltage, which control unit can be arranged, for example, on the substrate 14, the electrical connection 18 connecting the control unit to the electrode.

If a voltage is applied to the at least one electrode, this generates an electric field in the liquid crystal layer 17, whereupon the orientation of the liquid crystal molecules in the liquid crystal layer changes so that light which was previously unable to pass through the liquid crystal device 13 can now pass through the liquid crystal device 13 (so-called normally black mode) or, alternatively, light which could previously pass through the liquid crystal device 13 is now unable to pass through the liquid crystal device 13 (so-called normally transparent mode), to strike the sensor 11 of the camera device 10a.

Furthermore, for each of the electrodes, which are each allocated to a region, a common counter-electrode can be provided, or each of the electrodes can be provided with its own counter-electrode for generating an electric field between the respective electrode and the respective counter-electrode. The electrodes can be manufactured from a transparent conductive material so that they influence (that is to say absorb, reflect, refract or scatter) light passing through the liquid crystal device 13 as little as possible.

In FIG. 1A, the camera device 10a is provided by way of example behind a light inlet opening 19 of a surface 20 which is otherwise opaque to light. The surface 20 can be completely opaque to light or it can be permeable to light but have strong scattering properties so that it appears milky, for example. The surface 20 can have any desired colour; in particular, it can be a glossy or matt black surface that is opaque to light. In particular, the surface 20 can be a frame of a display device which serves to mechanically enclose the display device and visually hide specific control elements of the display device.

The light inlet opening 19 can be, for example, a circular, square or rectangular opening in the surface 20. The surface 20 can have anti-reflection properties at least in the region of the light inlet opening 19 (or over the entire surface). The anti-reflection properties can be provided by nanostructures or a layer composite (for example in the form of a coating).

In the embodiment shown in FIG. 1A, the elements of the camera device 10a are situated in the beam path wholly behind the light inlet opening 19, that is to say behind a rear side of the surface 20. In another embodiment, however, all or individual elements of the camera device 10a (for example the liquid crystal device 13 and/or the lens 12) can be situated in the beam path in front of the rear side of the surface 20.

A transparent front cover 21 can be provided in the beam path of the camera device 10a in front of the surface 20 and in front of the light inlet opening 19, which transparent front cover serves to protect the camera device 10a or to improve the visual appearance of the camera device 10a. In the case where the surface 20 is a frame of a display device, the transparent front cover 21 can be, for example, a common (shared) transparent front cover of the display device and of the camera device 10a.

Figure 1B:
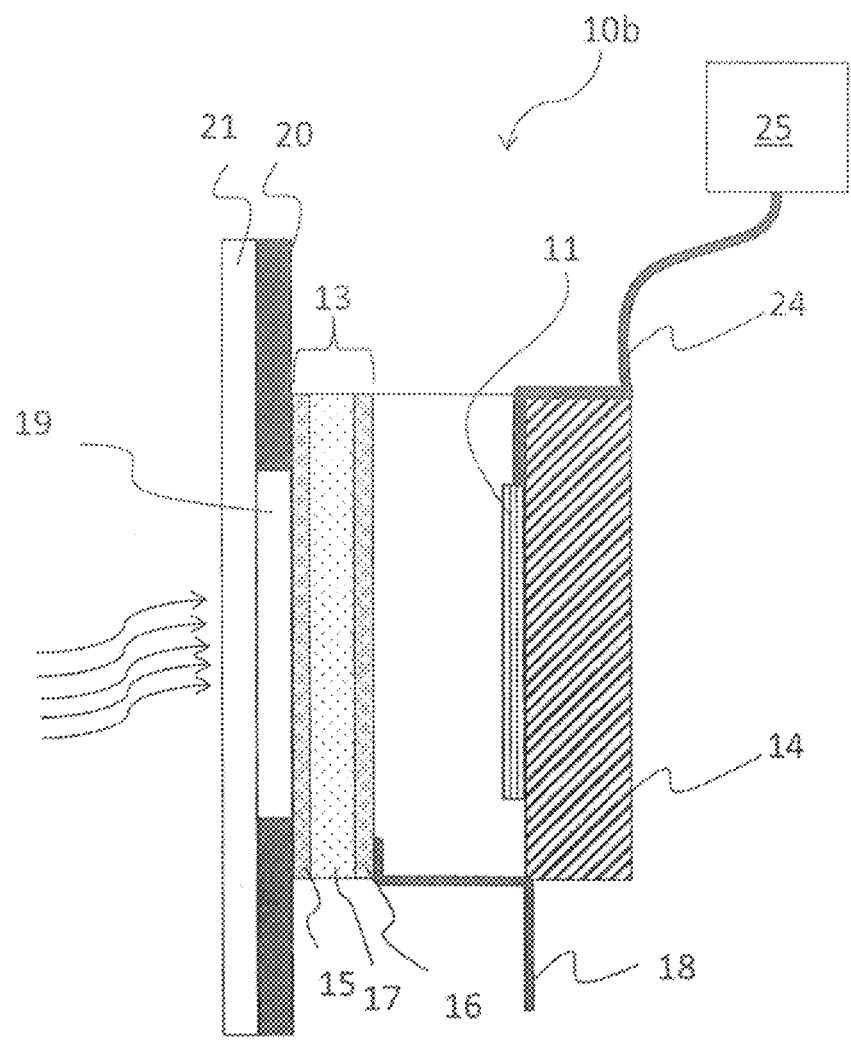
FIG. 1B is a schematic cross-section of an embodiment of an optical detection device which comprises a control device for controlling a display brightness of a display device.

FIG. 1B shows a schematic cross-section of an embodiment of an optical detection device 10b which comprises a control unit 25 for controlling the intensity of a display brightness of a display device. The optical detection device 10b of FIG. 1B is an ambient light sensor which detects the intensity of an ambient light and changes the intensity of a display brightness of a display device (not shown in FIG. 1B) on the basis of the detected intensity. The sensor 11 of the device 10b is a photodiode, a phototransistor or a light-dependent resistor. However, as an alternative, a CCD sensor or a CMOS sensor can also be used. In a variant, the sensor 11 emits only a single electrical signal which can correspond, for example, to a current value or to a voltage value and which is dependent on the intensity of the light that is incident upon the sensor.

The further features of the optical detection device 10b correspond to those of the features shown in FIG. 1A having identical reference numerals and fulfil a comparable purpose. They therefore do not require further explanation.

The device 10b further has a control device 25 which is connected to the sensor 11 via an electrical connection 24. The electrical signal passes via the electrical connection 24 to the control device 25. The control device 25 controls the display brightness of a display device (not shown in FIG. 1B) in such a manner that the display brightness is dependent on the electrical signal. For example, the display brightness can be so controlled that it is higher when more ambient light strikes the sensor 11. Ambient light which strikes a display device (and accordingly also the ambient light sensor 10b) can lead to a reduction in the perceived contrast and accordingly to a deterioration of the perception of the image displayed on the display device. This can be compensated for by increasing the display brightness of the display device, so that sufficient perceived contrast of the display device can be retained. When the environment of the display device is dark and a low intensity is detected by the sensor 11, a low display brightness of the display device is sufficient to display an image of good quality. The display device can be, for example, a liquid crystal display device which comprises a background illumination whose intensity can be controlled by the control device 25 so that the display brightness of the liquid crystal display device is changed. The display device can, however, also be an OLED or LED display device, for example, it being possible to change the display brightness of the display device by applying a higher or lower voltage to the OLEDs or LEDs.

By switching the liquid crystal device 13 into a completely opaque state, the underlying elements of the optical detection device 10b can be concealed. The optical detection device 10b can thus be visually incorporated into the appearance of a frame of the display device, for example, when ambient light measurement is not taking place or is not required (for example when the display device is switched off, or between two successive measurements).

Ambient light sensors from the prior art are frequently situated behind a partially permeable cover which is provided to hide the ambient light sensor from an observer and visually incorporate it into the appearance, for example, of a frame of a display device. However, the signal-to-noise ratio (SNR) is thereby reduced, because the intensity of the ambient light that is incident through the partially transparent cover in front of the sensor is reduced and the sensor 11 receives fewer photons than it would be able to receive without the partially transparent cover. By providing the optical device 10b described herein, the signal-to-noise ratio can be increased significantly because, in the transparent state (in the operating state of the ambient light sensor), the liquid crystal device 13 allows a large part of the ambient light to pass to the detector. The ambient light measurements therefore take place (e.g. cyclically) only when the liquid crystal device has briefly been switched to the transparent state.

The ambient light sensor 10b can either (as shown in FIG. 1B) have no lens or (similarly to the representation of FIG. 1A) can additionally have at least one lens for focusing the incident light onto the sensor 11.

Figure 2:
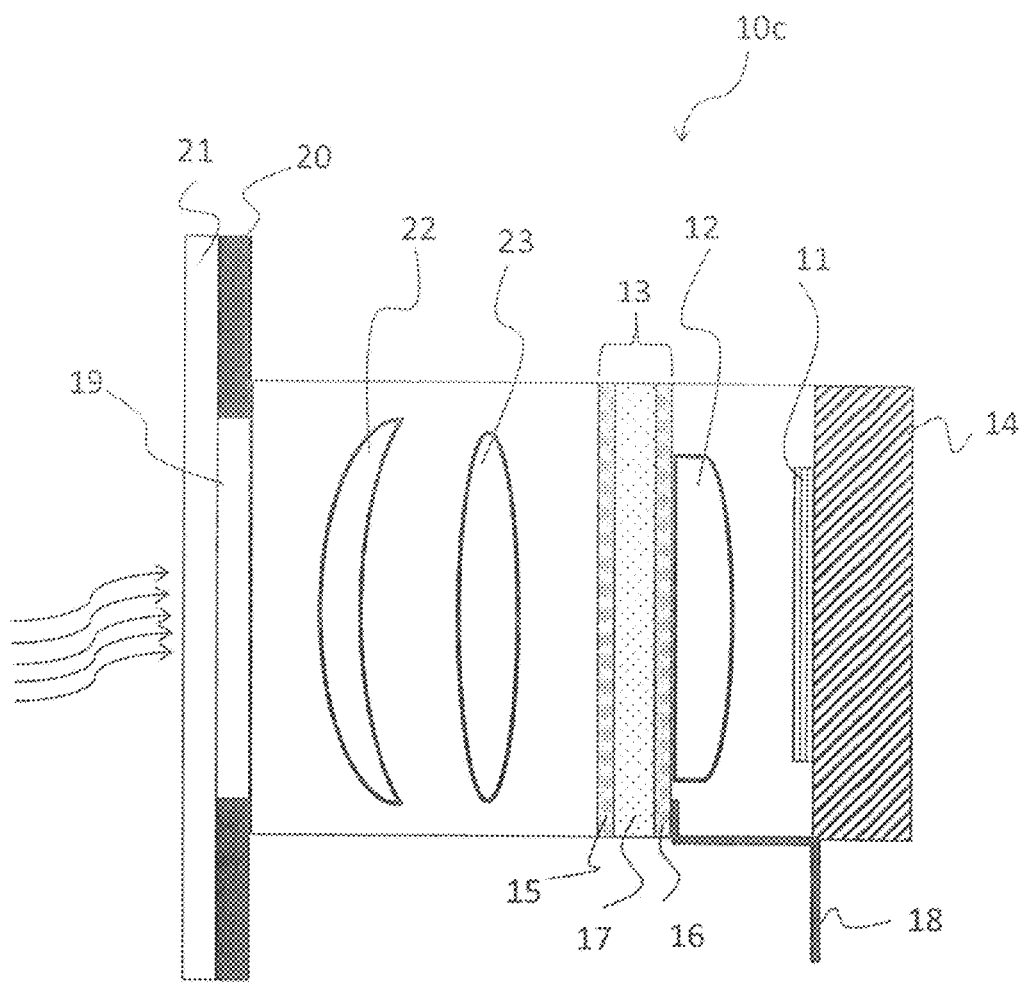
FIG. 2 is a schematic cross-section of an embodiment of an optical detection device which comprises a plurality of lenses.

FIG. 2 shows a schematic cross-section of an embodiment of an optical detection device 10c which, in addition to the features of the optical detection device 10a shown in FIG. 1A, has further lenses 22 and 23. Otherwise, the features having identical reference numerals correspond to the respective features of the optical detection device 10a shown in FIG. 1A, for which reason no further explanation is required. The optical detection device 10c in the embodiment is a camera device.

The lenses 22 and 23 are provided in the beam path in front of the sensor 11, the lens 12 and the liquid crystal device 13. As is shown in FIG. 2, the lenses 22 and 23 can be provided, for example, between the light inlet opening 19 and the liquid crystal device 13. Together with the lens 12, the lenses 22 and 23 serve to image an object which is situated in front of the camera device 10c on the sensor 11. For example, for sharp imaging (focusing) of the object, the lenses 22, 23 and 12 can each (individually or together) be movably mounted relative to the sensor 11, so that they can be moved in an electronically controlled manner parallel to the optical axis of the camera device 10c (the horizontal direction in FIG. 2) or tilted relative to the optical axis. In addition or alternatively, the sensor 11 can also be movably mounted (e.g. for focusing). The embodiment shown in FIG. 2 has the advantage that, by using a plurality of lenses, optical imaging on the sensor 11 can be improved so that imaging errors can be reduced and, for example, a sharper image can be achieved.

Figure 3A:
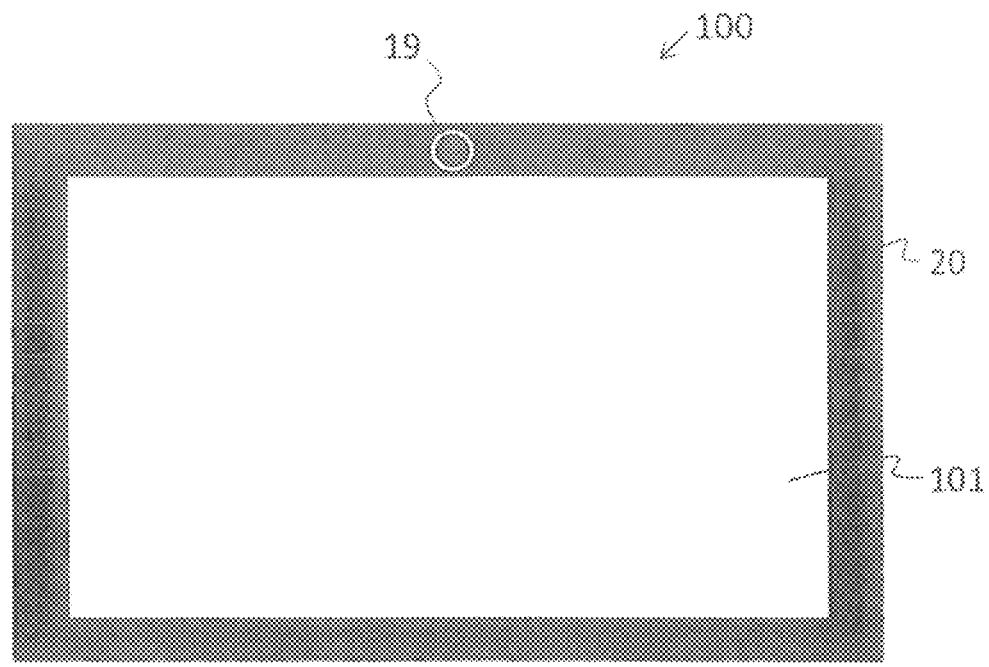
FIG. 3A is a schematic plan view of an embodiment of an electronic device, wherein the at least one region is in a substantially opaque state.
Figure 3B:
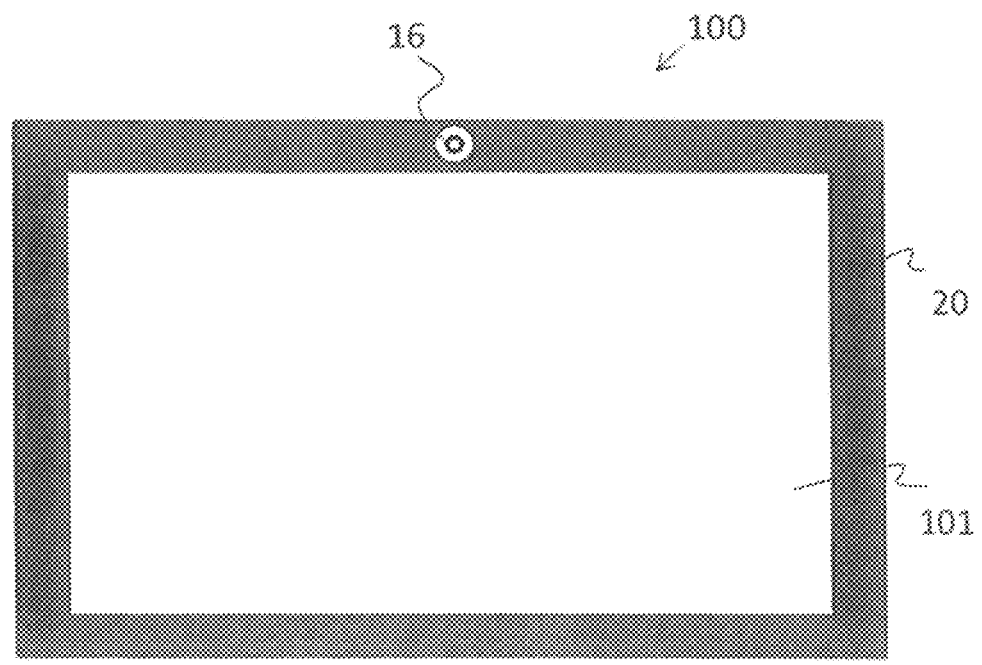
FIG. 3B is a schematic plan view of an embodiment of an electronic device, wherein the at least one region is in a substantially transparent state.

FIG. 3A and FIG. 3B each show a schematic plan view of an embodiment of an electronic device 100. In the representation of FIG. 3A, the at least one region of the liquid crystal device 13 is in a substantially opaque state, and in the representation of FIG. 3B, the at least one region of the liquid crystal device 13 is in a substantially transparent state, as will be explained in greater detail below.

The electronic device 100 can be, for example, a tablet computer, a laptop computer, a mobile telephone (smart phone), a television, an E-book reading device, a control device set into a console of a motor vehicle, or any desired combination of the above-mentioned devices. The electronic device 100 has a display device 101, which can be, for example, a liquid crystal display device, an OLED display device or an E-paper display device with or without touch sensitivity for detecting touch gestures (touch screen). Alternatively (not shown in FIGS. 3A and 3B), the electronic device does not have a display device but instead has only operating members (buttons and/or switches) and/or lights (e.g. LEDs).

The display device 101 is enclosed in a frame 20, which surrounds the surface 20 shown in FIGS. 1A, 1B and 2. The frame 20 is formed, for example, from a matt or glossy black material which is opaque to light, and it comprises an aperture (light inlet opening 19) behind which there is situated an optical detection device 10a, 10b or 10c as described above in connection with FIGS. 1A, 1B and 2. The optical detection device here serves, for example, as a camera device for recording photographs or videos of a user or of the surroundings/landscape or for conducting video calls. However, it can also serve to detect the intensity of an ambient light.

In the representation of FIG. 3A, the liquid crystal device 13 of the optical detection device 10a, 10b, 10c is substantially impermeable to light (opaque), that is to say the at least one region of the liquid crystal device 13 is in a substantially opaque state. The "substantially opaque state" (also "opaque state" hereinbelow) is a state of the region of the liquid crystal device 13 in which the region is as impermeable to light as is technically possible. If the liquid crystal device 13 is a liquid crystal device in normally black mode, then the substantially opaque state is, for example, a state in which no voltage is applied to the at least one electrode, that is to say in which no electric field is generated in the liquid crystal layer 17. A "substantially transparent state" (also "transparent state" hereinbelow) is a state of the region of the liquid crystal device 13 in which the region is as permeable to light as is technically possible. If the liquid crystal device 13 is a liquid crystal device in normally black mode, then the substantially transparent state is, for example, a state in which a maximum value of a voltage $U_{max}$ is applied to the at least one electrode, that is to say in which a maximum value of an electric field is generated in the liquid crystal layer 17.

In the representation of FIG. 3A, the contours of the light inlet opening 19 are shown as a light edge for the sake of clarity. In the opaque state shown in FIG. 3A, however, there is ideally actually no visible difference between the frame 20 and the light inlet opening 19, that is to say the light inlet opening 19 does not differ visually from the surrounding frame and is accordingly incorporated harmoniously into the optical appearance of the electronic device 100. As a result, the elements of the optical detection device 10a, 10b, 10c that are located behind the liquid crystal device 13 (for example the lens 12 and the sensor 11) are hidden behind the liquid crystal device 13. In order to hide those elements of the optical detection device 10a, 10b, 10c completely behind the liquid crystal device 13, it is desirable for the at least one region whose light transmission is electronically controllable to cover the light inlet opening 19 over the entire surface when seen in a plan view (as shown in FIG. 3A). In other words, when seen in a plan view, a surface of the liquid crystal device 13 in which the at least one region is provided overlaps the light inlet opening 19 completely.

To that end it is possible, for example, to provide a single region, that is to say only one region, which covers the light inlet opening 19 over the entire surface when seen in a plan view. It is also possible, however, to provide a plurality of regions which in their totality cover the light inlet opening 19 over the entire surface when seen in a plan view. Alternatively or in addition, it is possible to provide a single region, that is to say only one region, which covers the lens 12 over the entire surface when seen in a plan view. It is also possible, however, to provide a plurality of regions which in their totality cover the lens 12 over the entire surface when seen in a plan view. The arrangement described herein of the at least one region is not limited to the embodiment of FIGS. 3A and 3B but can be applied to all camera devices described herein (for example the optical detection devices 10a, 10b and 10c described in relation to FIGS. 1A, 1B and 2). An optical detection device 10a, 10b, 10c does not necessarily comprise a light inlet opening 19 which is situated in the beam path of the optical detection device 10a, 10b, 10c in front of the liquid crystal device 13. In this case, or in the case where a seamless visual adaptation of the optical detection device to its surroundings is not desired, it is sufficient for the at least one region to cover the lens 12 over the entire surface when seen in a plan view. When the at least one region covers the lens 12 over the entire surface when seen in a plan view, the optical detection device 10a, 10c cannot record any images in the opaque state of the at least one region and the privacy of a user can accordingly be protected.

In the example of FIG. 3A, all the regions (or in the case of only a single region, the single region) are in the opaque state and the optical detection device is hidden. This has the advantage on the one hand that the optical detection device is visually incorporated into the appearance of the surrounding frame 20 and is accordingly concealed. A further advantage is that the optical detection device 10a, 10c cannot record any undesired images of a user of the electronic device 100 because no light (or at least insufficient light) strikes the sensor 11 of the optical detection device 10a, 10c.

If the user wishes to use the optical detection device 10a, 10c for recording photographs or videos, the opaque state of the at least one region is changed into the transparent state, as shown in FIG. 3B. To that end, a voltage value applied to the at least one electrode is changed. In the case of a normally black mode of the liquid crystal device 13, no voltage is applied to the at least one electrode in the opaque state of the at least one region, and in the transparent state (see FIG. 3B), a maximum value of a voltage $U_{max}$ is applied to the at least one electrode. The change from the opaque state to the transparent state can take place either substantially suddenly (by applying a specific, for example maximum voltage $U_{max}$) or continuously (by continuously increasing the voltage applied to the at least one electrode from 0 V to $U_{max}$). The at least one region has at least one partially opaque state (intermediate state) in which the light transmission of the region lies between the maximum light transmission of the transparent state and the minimum light transmission of the opaque state.

As is shown in FIG. 3B, the optical detection device 10a, 10c is visible in the transparent state of the at least one region of the liquid crystal device 13 and can accordingly be used to record images.

Figure 4A:
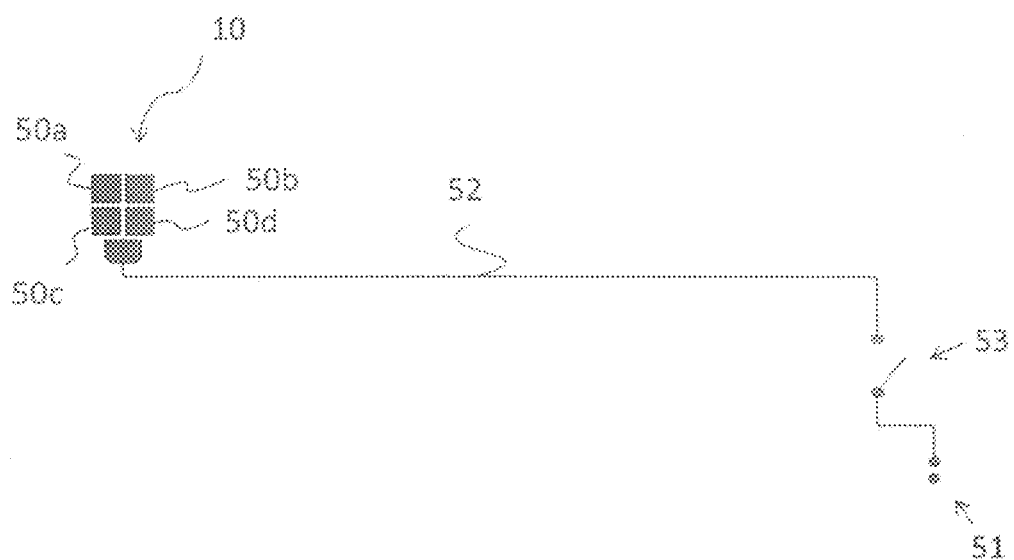
FIG. 4A is a schematic representation of an embodiment of an optical detection device, wherein the at least one region is in a substantially opaque state.
Figure 4B:
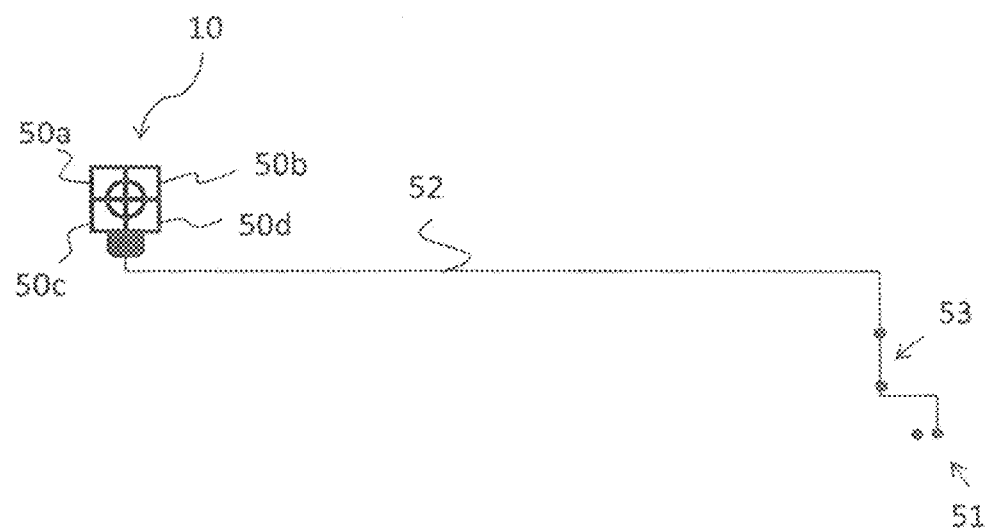
FIG. 4B is a schematic representation of an embodiment of an optical detection device, wherein the at least one region is in a substantially transparent state.

FIG. 4A and FIG. 4B each show a schematic representation of an embodiment of an optical detection device 10 (which, for example, is integrated into the electronic device 100 according to FIG. 3A and FIG. 3B). The optical detection device can correspond, for example, to one of the optical detection devices 10a, 10b or 10c shown in FIG. 1A, 1B or 2. The at least one region is in the substantially opaque state in the representation of FIG. 4A and in the substantially transparent state in the representation of FIG. 4B. FIGS. 4A and 4B illustrate aspects of the control of the optical detection device 10 described herein, the electrical control for controlling the light transmission of the at least one region being shown in particular.

FIG. 4A shows schematically an optical detection device 10 in a plan view. The liquid crystal device 13 of the optical detection device 10 shown in the embodiment of FIG. 4A comprises, for example, four square regions 50a, 50b, 50c, 50d which are arranged in the form of a matrix. In order to permit this arrangement of the regions, four square electrodes, for example, can be provided, which electrodes are arranged in the form of a matrix and can be electronically controlled individually. However, the form, arrangement and number of the regions and of the electrodes are not limiting in any way, and the liquid crystal device 13 can comprise regions of any desired form in any desired arrangement and in any desired number. In the representation of FIG. 4A, all the regions 50a-d are in the opaque state and are therefore shown in black. In order to cover (and hence conceal) the optical detection device 10 as completely as possible under the regions, the regions can be so arranged that a distance between the regions is as small as possible or even non-existent. To that end, the electrodes of the respective regions can be so arranged that a distance between the adjacent electrodes is as small as possible.

A voltage source 51 is provided, which is able to supply the electrodes of the optical detection device 10 with a voltage via an electric wire 52, so that an electric field is generated in the liquid crystal layer 17. A switch 53 is further provided, which switch can be closed in order to apply the voltage and opened in order to interrupt the voltage supply. In FIGS. 4A and 4B there is shown by way of example only one switch 53 and one electric wire 52 which supply the four electrodes belonging to the four regions 50a-d with a common voltage. However, it is also possible to provide a switch and an electric wire for each of the regions 50a-d, so that the electrodes of the regions 50a-d can be supplied with a voltage individually.

The switch 53 can be so designed that it allows the voltage to be increased gradually from 0 V to a maximum value $U_{max}$ (e.g. as a sliding controller). The switch 53 can further be part of an integrated switching circuit. The switch 53 can, for example, be part of an integrated switching circuit of an electronic device (for example of the electronic device 100 of FIGS. 3A and 3B) and be controlled by specific user inputs. The switch 53 can also be controlled, for example, by commands of a program which runs on the electronic device. The switch 53 can be so controlled, for example, that it is closed when an application which uses the optical detection device 10 (a photograph recording application or a video recording application) is opened on the electronic device.

In some embodiments, the switch 53 can be provided on an outer side of a casing of an electronic device (for example of the electronic device 100 of FIGS. 3A and 3B), so that a user of the electronic device is able to operate the switch 53 by hand when he wishes to use the optical detection device 10. By arranging the switch 53 on the outer side of the electronic device, the user retains control over the "opening" and "closing" of the optical detection device 10 and it is thus ensured that no program of the electronic device can operate the switch unnoticed. The user's privacy is accordingly ensured.

FIGS. 4A and 4B show a liquid crystal device 13 in normally black mode. In other words, when the switch 53 is in the open state (FIG. 4A), no voltage is applied to the electrodes of the optical detection device 10, no electric field is generated in the liquid crystal layer 17, and the regions 50a-d are in the opaque state. When the switch 53 is in the closed state (FIG. 4B), a voltage is applied to the electrodes of the optical detection device 10, an electric field is generated in the liquid crystal layer 17, and the regions 50a-d are in the transparent state and the optical detection device 10 can be used to record images. In normally black mode, therefore, the at least one region is in the substantially opaque state when no voltage is applied to the at least one electrode.

It is also possible, however, for the liquid crystal device 13 to be a liquid crystal device in normally white mode, in which an electric field that is generated results in the opaque state and the regions are in the transparent state when no voltage is applied to the electrodes.

When a liquid crystal device 13 is used in normally black mode, no voltage has to be applied in order to shift the regions into the opaque state and cover the optical detection device. When the optical detection device 10 is provided in an electronic device 100, it can be desirable for the optical detection device 10 to be hidden when the electronic device 100 is switched off, in order to improve a visual appearance of the device and/or to ensure the privacy of a user. When a liquid crystal device 13 is used in normally black mode, the at least one electrode of the optical detection device 10 does not have to be supplied with voltage when the electronic device 100 is switched off, which reduces the power consumption of the electronic device 100.

Figure 5:
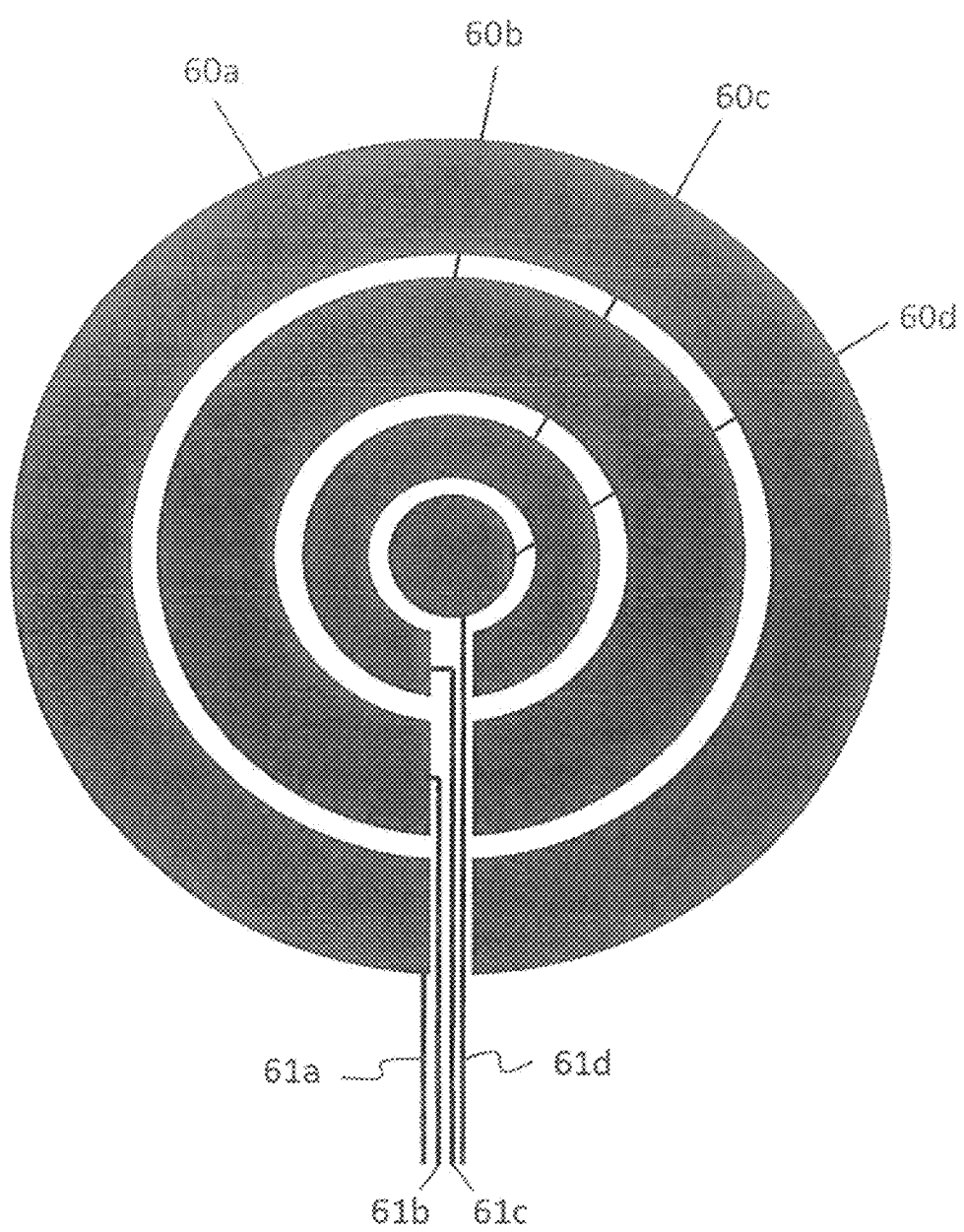
FIG. 5 is a schematic plan view of an embodiment of an arrangement of a plurality of regions as concentric rings.

FIG. 5 shows a schematic plan view of an embodiment of an arrangement of a plurality of regions as concentric rings (e.g. for the electronic device 100 according to FIGS. 3A and 3B). In the representation of FIG. 5, the electrodes 60a, 60b, 60c, 60d of the respective regions are shown. In order to supply the electrodes 60a-d with voltage individually, electric wires 61a, 61b, 61c, 61d are provided, which electric wires are electrically connected to the respective electrodes 60a-d. The electrodes 60a-c each have substantially the shape of an annulus. The middle electrode 60d is circular. The electrodes 60a-d are arranged concentrically. The annulus shape of the electrodes 60a-c can be broken by openings for the electric wires 61a-d. The electrodes 60a-60d can be electronically actuated individually, so that the associated regions of the liquid crystal device 13 can be switched individually into the opaque state and into the transparent state. It is, however, also possible for the regions additionally to be switched individually into an arbitrary number of intermediate states between the opaque state and the transparent state.

By means of the arrangement of FIG. 5, apertures (diaphragm openings) of different sizes can be produced. The regions can be switched in such a manner that all the regions are in the transparent state, which leads to a maximum light yield and can be advantageous when an image is to be recorded in low ambient light or a low definition is to be achieved. If only some of the inner regions (for example the regions associated with electrodes 60c and 60d) are switched into the transparent state and the remaining outer regions (for example the regions associated with electrodes 60a and 60b) are switched into the opaque state, a circular diaphragm (iris) having the outside diameter of the annulus of electrode 60c can be achieved. Smaller diaphragms can be advantageous to achieve a high depth of focus or when images are recorded under bright conditions. Furthermore, all the regions of the electrodes 60a-60d can be switched into the opaque state, as a result of which the above-described effect of hiding the optical detection device can be achieved, but the sensor 11 can also be protected from incident light.

The diaphragm function in conventional camera devices is usually performed by mechanical blades. However, these are mechanically delicate and expensive to produce. By providing the "liquid crystal diaphragm" described herein, a diaphragm function can be ensured inexpensively and robustly. It should be noted that the concentric rings according to FIG. 5 can also be realised by means of regions arranged in matrix form.

Figure 6:
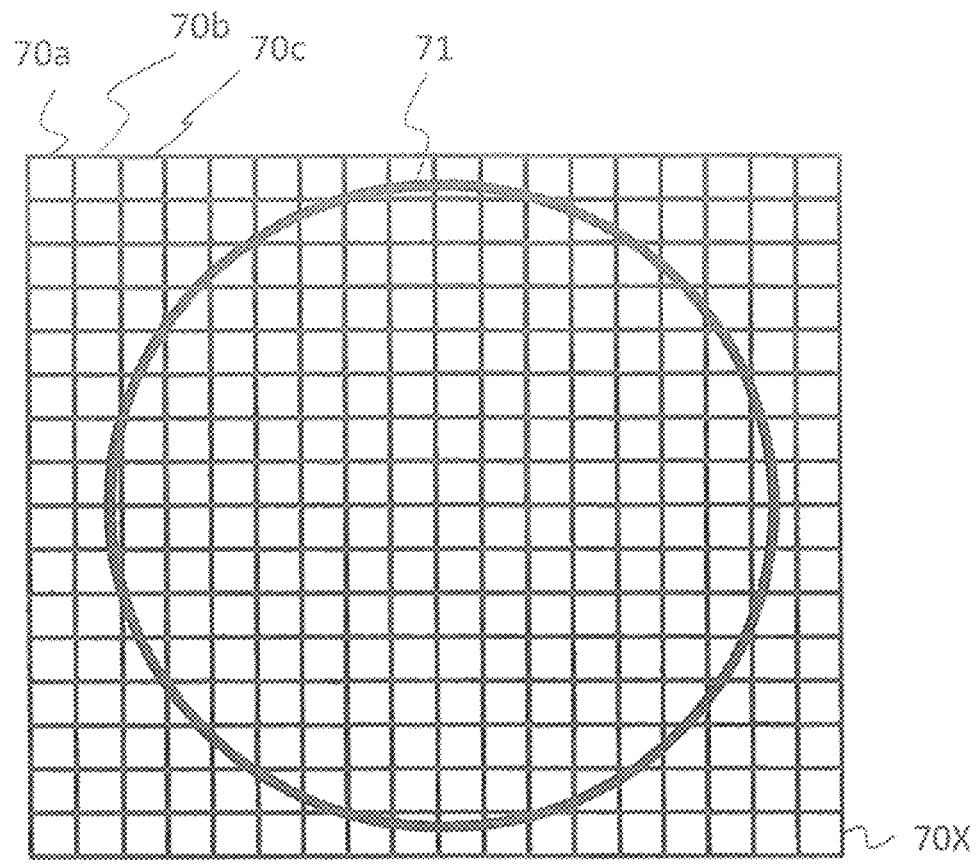
FIG. 6 is a schematic plan view of an embodiment of an arrangement of a plurality of regions as a matrix.

FIG. 6 shows a schematic plan view of an embodiment of an arrangement of a plurality of regions 70a, 70b, 70c, . . . , 70X as a matrix, not all of the regions shown being provided with a reference numeral. The ring 71 shown in FIG. 6 symbolises the contour of either the lens 12 or the light inlet opening 19. The regions 70a-X in their totality can cover the lens 12 and/or the light inlet opening 19 over the entire surface when seen in a plan view. Any desired number of, for example, rectangular or square regions can be provided in a matrix. The number and accordingly the size of the regions 70a-X can be so chosen that a good approximation of a circular or annular diaphragm (iris) can be achieved.

The regions can be controlled individually, so that the opaque state, the transparent state and optionally at least one intermediate state can be produced for each of the regions 70a-X individually. For example, for each of the regions 70a-X, an electrode can be provided on one side of the liquid crystal layer 17 of the liquid crystal device 13. A common counter-electrode can be provided on the other side of the liquid crystal layer 17.

With the arrangement shown in FIG. 6 it is possible to produce almost any aperture shape. For example, similarly to the arrangement shown in FIG. 5, it is possible by suitably controlling the respective electrodes to produce circular apertures and annular apertures of different diameters. By producing an intermediate state between the opaque state and the transparent state it is possible, for example, to achieve a grey filter (ND filter). This can be advantageous when the amount of light striking the sensor 11 is to be reduced, for example in order to be able to take photographs with a long exposure time. Furthermore, a grey filter with graduation (for example from top to bottom or from right to left) can be achieved by varying the voltage values applied to the respective electrodes. A grey filter (for example with graduation) can be used, for example, to compress the dynamic range of a recorded image. If, for example, a minimum voltage value is 0 V and a maximum voltage value is $U_{max}$, voltage values between 0 V and $U_{max}$ can be applied to the respective electrodes in order to shift the respective regions into intermediate states and in order to obtain a grey filter or a grey filter with graduation.

If, for example, a grey filter with a greyscale graduation from top to bottom is to be obtained, the regions can be actuated in such a manner that a high voltage value $U_{high}$ is applied to the electrodes of the regions in the uppermost row of the matrix (see FIG. 6) and a low voltage value $U_{low}$ is applied to the electrodes of the regions in the lowermost row of the matrix, and voltage values between $U_{high}$ and $U_{low}$ are applied to the electrodes of the regions in the rows between the uppermost and the lowermost rows so that a transition from $U_{high}$ to $U_{low}$ that is as continuous as possible is obtained over the course of the liquid crystal device 13. $U_{high}$ can be, for example, a voltage value which is identical with the maximum voltage value $U_{max}$, and $U_{low}$ can be, for example, a voltage value of 0 V. $U_{high}$ and $U_{low}$ can, however, also represent any desired intermediate values between 0 V and $U_{max}$.

In order to produce a homogeneous grey filter, it is also possible, for example, to provide a liquid crystal device 13 having only one region which can be switched into an intermediate state between the opaque state and the transparent state. The arrangement according to FIG. 6 is also suitable for use in the electronic device 100 according to FIGS. 3A and 3B.

FIGS. 7A, 7B, 7C and 7D show different embodiments of aperture shapes which can be produced with the regions of the optical detection device described herein, for example for the electronic device 100 according to FIGS. 3A and 3B.

The black areas of the figures each represent regions in the opaque state, and the white areas each represent regions in the transparent state. The diaphragm shapes of FIGS. 7A-D can each be achieved by different electrode arrangements. In order to obtain the black areas it is possible, for example, either to provide one region or to provide a plurality of adjacent regions (for example in a matrix arrangement) which together can be switched into the opaque state. In order to obtain the white areas, it is possible, for example, either to provide one region or to provide a plurality of adjacent regions (for example in a matrix arrangement) which together can be switched into the transparent state.

Figure 7A:
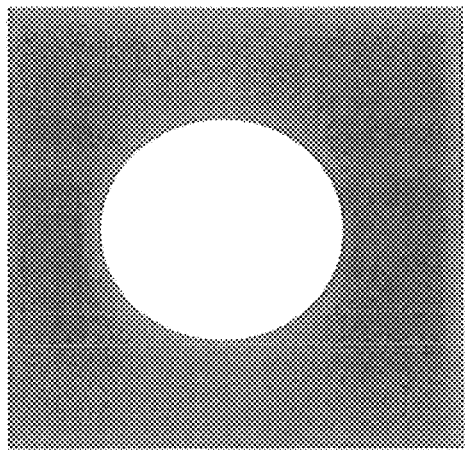
FIG. 7A is a schematic plan view of an embodiment of an arrangement of substantially opaque and substantially transparent regions so that a circular opening is obtained.

FIG. 7A shows a circular aperture as can be achieved, for example, by corresponding control of the electrode arrangement shown in FIG. 5.

Figure 7B:
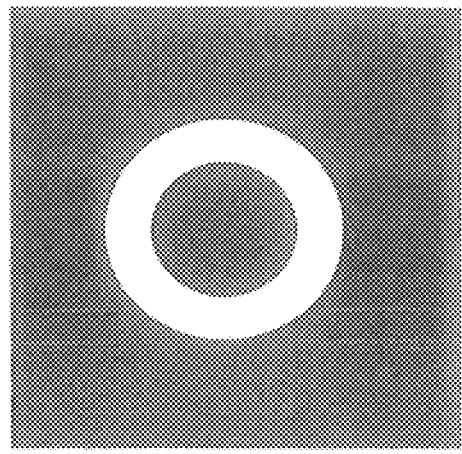
FIG. 7B is a schematic plan view of an embodiment of an arrangement of substantially opaque and substantially transparent regions so that an annular opening is obtained.

FIG. 7B shows an annular aperture as can be achieved, for example, by corresponding control of the electrode arrangement shown in FIG. 5.

Figure 7C:
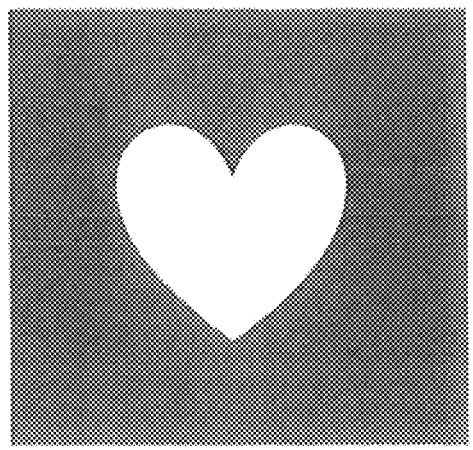
FIG. 7C is a schematic plan view of an embodiment of an arrangement of substantially opaque and substantially transparent regions so that a heart-shaped opening is obtained.

FIG. 7C shows a heart-shaped aperture as can be achieved, for example, by corresponding control of the matrix arrangement of the regions shown in FIG. 6.

Figure 7D:
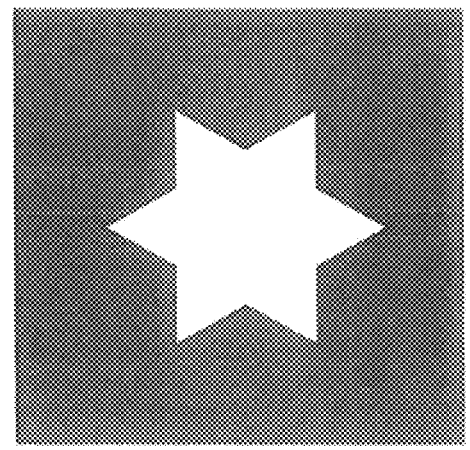
FIG. 7D is a schematic plan view of an embodiment of an arrangement of substantially opaque and substantially transparent regions so that a star-shaped opening is obtained.

FIG. 7D shows a star-shaped aperture as can be achieved, for example, by corresponding control of the matrix arrangement of the regions shown in FIG. 6.

The aperture shapes shown in FIGS. 7A-D can be used, for example, to achieve an artistic aperture effect or bokeh effect, in which out-of-focus regions of a recorded image adopt the shape of the aperture in question. For example, by using the annular diaphragm shown in FIG. 7B, the bokeh of a mirror-lens objective can be imitated.

In the examples which have been described, different features of the present disclosure have been described separately from one another and also in specific combinations. It will be appreciated, however, that many of these features, where not explicitly excluded, can freely be combined with one another.

The invention claimed is:

1. An electronic device comprising a display device;
   a frame surrounding the display device and thereby defining an opening for the display device and comprising a light inlet opening spaced apart from the opening for the display device; and
   an optical detection device comprising:
   a sensor having a light incident side, wherein the sensor is designed to convert light that is incident upon the light incident side into an electrical signal;
   at least one lens; and
   a liquid crystal device which is arranged in front of the light incident side of the sensor in such a manner that the at least one lens is situated between the liquid crystal device and the sensor, wherein the liquid crystal device comprises at least one region whose light transmission is electronically controllable, wherein
   the optical detection device is provided behind the light inlet opening of the frame, and
   the at least one region covers entire light inlet opening when seen in a plan view, and has anti-reflection property.

2. An electronic device comprising a display device;
   a frame surrounding the display device and thereby defining an opening for the display device and comprising a light inlet opening spaced apart from the opening of the display device; and
   an optical detection device comprising:
   a sensor having a light incident side, wherein the sensor is designed to convert light that is incident upon the light incident side into an electrical signal;
   a liquid crystal device which is arranged in front of the light incident side of the sensor, wherein the liquid crystal device comprises at least one region whose light transmission is electronically controllable; and
   a control device for controlling a display brightness of a display device on the basis of the electrical signal, wherein
   the optical detection device is provided behind the light inlet opening of the frame, and the at least one region covers entire light inlet opening when seen in a plan view, and has anti-reflection property.

3. The optical detection device according to claim 2, wherein
   the liquid crystal device comprises:
   a first polarisation filter, a second polarisation filter, a liquid crystal layer situated between the first polarisation filter and the second polarisation filter, and a least one electrode for generating an electric field in the liquid crystal layer, wherein
   the light transmission of the at least one region is controllable in dependence on the electric field that is generated.

4. The optical detection device according to claim 3, wherein
   the light transmission of the at least one region can be switched at least between a substantially transparent state and a substantially opaque state.

5. The optical detection device according to claim 4, wherein the at least one region is in the substantially opaque state when no voltage is applied to the at least one electrode.

6. The optical detection device according to claim 4, wherein
the at least one region can be switched between the substantially transparent state, the substantially opaque state and at least one partially opaque state.

7. The optical detection device according to claim 2, wherein
the liquid crystal device comprises a plurality of regions whose light transmission is individually electronically controllable.

8. The optical detection device according to claim 7, wherein
the regions are arranged as a matrix.

9. The optical detection device according to claim 7, wherein
the regions are arranged as concentric rings.

10. The optical detection device according to claim 7, wherein
the single region or the plurality of regions in their totality cover at least one of the lens and the sensor over the entire surface when seen in a plan view.

11. The optical detection device according to claim 2, wherein
the liquid crystal device comprises a single region whose light transmission is electronically controllable.

12. The electronic device according to claim 2, wherein a common transparent front cover is provided in front of the optical detection device and the display device.

13. The electronic device according to claim 2, wherein a switch is provided on an outer side of a casing of the electronic device, for switching the at least one region from a substantially opaque state into a substantially transparent state.

14. A method of controlling an electronic device comprising a display device, a frame surrounding the display device and thereby defining an opening for the display device and comprising a light inlet opening spaced apart from the opening of the display device, and an optical detection device which comprises a sensor having a light incident side, wherein the sensor is designed to convert light that is incident upon the light incident side into an electrical signal, and a liquid crystal device which is arranged in front of the light incident side of the sensor, wherein the method comprises:
electronically controlling the light transmission of at least one region of the liquid crystal device; and
controlling a display brightness of a display device on the basis of the electrical signal, wherein
the optical detection device is provided behind the light inlet opening of the frame, and
the at least one region covers entire light inlet opening when seen in a plan view, and has anti-reflection property.

15. The method according to claim 14, wherein the at least one region is switched briefly into a state of high light transmission for the acquisition of the electrical signal.

* * * * *